(12) United States Patent
Whitney

(10) Patent No.: US 7,059,391 B2
(45) Date of Patent: Jun. 13, 2006

(54) MULTIPLE EVAPORATOR HEAT PIPE ASSISTED HEAT SINK

(75) Inventor: Bradley Robert Whitney, Boscawen, NH (US)

(73) Assignee: Aavid Thermalloy, Inc., Concord, NH (US)

( * ) Notice: Subject to any disclaimer, the term of this patent is extended or adjusted under 35 U.S.C. 154(b) by 0 days.

(21) Appl. No.: 11/100,819

(22) Filed: Apr. 7, 2005

(65) Prior Publication Data

US 2005/0224217 A1 Oct. 13, 2005

Related U.S. Application Data

(60) Provisional application No. 60/560,869, filed on Apr. 9, 2004.

(51) Int. Cl.
F28D 15/00 (2006.01)

(52) U.S. Cl. .............. 165/104.33; 165/104.21; 165/80.4; 361/697; 361/700; 174/15.2; 257/714

(58) Field of Classification Search ........... 165/104.33, 165/104.21, 104.26, 80.4; 361/697, 700, 361/704; 257/714–716; 174/15.2
See application file for complete search history.

(56) References Cited

U.S. PATENT DOCUMENTS

| | | | | |
|---|---|---|---|---|
| 4,921,041 A * | 5/1990 | Akachi | ................. | 165/104.29 |
| 5,219,020 A * | 6/1993 | Akachi | ................. | 165/104.26 |
| 5,829,516 A | 11/1998 | Lavochkin | | |
| 6,189,601 B1 | 2/2001 | Goodman et al. | | |
| 6,394,175 B1 * | 5/2002 | Chen et al. | ................. | 165/80.3 |
| 6,542,364 B1 * | 4/2003 | Lai et al. | ................... | 361/697 |
| 6,688,380 B1 | 2/2004 | Lavochkin et al. | | |
| 6,779,595 B1 * | 8/2004 | Chiang | ................. | 165/104.33 |
| 6,909,608 B1 * | 6/2005 | Fan | ........................... | 361/700 |
| 6,915,844 B1 * | 7/2005 | Chou | ................... | 165/104.33 |
| 6,918,429 B1 * | 7/2005 | Lin et al. | ................... | 165/80.3 |
| 6,945,319 B1 * | 9/2005 | Li et al. | ................. | 165/104.33 |
| 6,955,214 B1 * | 10/2005 | Wang | ................... | 165/104.33 |
| 2003/0019610 A1 * | 1/2003 | Liu | ........................... | 165/80.3 |
| 2003/0111217 A1 * | 6/2003 | Li | ............................... | 165/185 |
| 2003/0173061 A1 * | 9/2003 | Lai et al. | ................... | 165/80.4 |
| 2004/0035558 A1 * | 2/2004 | Todd et al. | ............. | 165/104.26 |
| 2004/0074633 A1 * | 4/2004 | Liu | ........................... | 165/80.3 |
| 2004/0194928 A1 * | 10/2004 | Lee et al. | ............. | 165/104.21 |

* cited by examiner

Primary Examiner—Terrell Mckinnon
(74) Attorney, Agent, or Firm—Cohen, Pontani, Lieberman & Pavane

(57) ABSTRACT

A heat sink includes a base plate which is fitted against a component to be cooled, and a heat pipe formed as a loop having a condenser portion upstanding from the base plate and a pair of ends which form a pair of evaporator portions received in parallel channels in the base plate. A wall upstanding from the base plate between the channels is formed with an upright channel which receives the condenser portion substantially within the profile of the wall, so that a plurality of horizontal cooling fins can be fixed to the wall in thermal contact with the condenser portion.

19 Claims, 4 Drawing Sheets

MULTIPLE EVAPORATOR HEAT PIPE ASSISTED HEAT SINK

PRIORITY CLAIM

This application claims priority under 35 USC §119(e) from U.S. provisional application No. 60/560,869 filed on Apr. 9, 2004, the entire disclosure of which is incorporated herein by reference.

BACKGROUND OF THE INVENTION

1. Field of the Invention

The invention relates to a heat sink having a base plate incorporating at least an evaporator portion of a heat pipe, and cooling fins which dissipate heat so that a cooling medium will condense in a condenser portion of the heat pipe.

2. Description of the Related Art

Components such as high power CPU's in a computer generate heat which must be removed so that the component will not overheat and fail. To this end, such components are provided with copper lids to which a heat sink is fixed using mounting hardware which engages the PCB or other substrate to which the component is mounted. The lids generally have a hot spot from 10 to 25 mm square generating 80–150 watts or more. Heat sinks generally include a base plate having a bottom surface which is fixed against the copper lid on the component, and a top surface having cooling fins which dissipate the heat to the surrounding air, which may be circulated.

High efficiency heat sinks include a heat pipe having at least a portion embedded in a base plate of the heat sink; "heat pipe" is a term which refers to a closed pipe containing a working fluid such as water which is present in two phases, liquid and gas. A portion of the heat pipe is placed over the hot spot and thereby serves as an evaporator, while a portion remote from the evaporator serves as a condenser which returns liquid to the evaporator. The evaporation and condensing cool the component efficiently until the heat load becomes so great that the working fluid evaporates faster than the condensing fluid can return to the evaporator, at which point the evaporator "dries out". Once the evaporator dries out, the increase in temperature with increased power is orders of magnitude greater than before the dry out point was reached. The process of moving heat is essentially reduced to conduction by the thin walled tube.

Heat sinks with heat pipes entirely embedded in a base plate are best suited for short fin heights. The heat pipes are preferably pressed into channels in the bottom of the base plate and machined flush so that the heat pipes present a flat surface for good heat transfer from the hot spot on the component. A liquid cooled heat sink with a conduit formed in this way is disclosed in U.S. Pat. No. 5,829,516. Multiple heat pipes, for example configured as interlocking U's having adjacent inside arms over the hot spot, transfer heat to the condenser portions in the outside arms at a much higher rate than the material of the base plate. Single heat pipes with multiple evaporators are also known, e.g. in the shape of a heart having substantially parallel ends which serve as evaporators and an outside loop for the condenser, and a "figure 8" formed with two loops connected by an intermediate section extending between the ends.

Tower style heat sinks employ a base plate with channels which receive evaporator portions of "L" or "U" shaped heat pipes having upstanding condenser portions which carry the heat perpendicular to the base into a horizontal fin stack. This is especially effective for tall heat sinks (3"+). For shorter heat sinks the fins on the bend radii of the heat pipes provide a significant part of the fin area, and can adversely affect heat transfer to the fins. This results from the necessity of providing varying hole spacings in the fins, or slots which only contact one side of the heat pipe at the bend radii. This type of heat sink is also hard to design due to the conflict between locating the mounting hardware and optimal location of the heat pipes.

Heat sinks have also been designed with "U" shaped heat pipes having one arm serving as an evaporator embedded in the base plate, and another arm which loops into a vertical fin structure upstanding from the base plate. The main drawback is that the bend or bight of the U must be located outside of the fins, or placed within large notches in the fins. A heat sink of this type is disclosed by U.S. Pat. No. 6,189,601.

SUMMARY OF THE INVENTION

According to the invention, the heat pipe is formed as a loop having a condenser portion upstanding from the base plate and a pair of ends which form a pair of evaporator portions in thermal contact with the base plate and extending parallel to the base plate. The cooling fins are in thermal contact with the condenser portion, and extend substantially parallel to the base plate.

According to one embodiment, the base plate is formed with a pair of parallel base channels which extend between the top and bottom surfaces of the heat sink, and an upright wall between the channels, the structure having an inverted "T" profile. The base channels receive the evaporators so that they are flush with the bottom surface of the base plate, and the condenser portion is received in a channel in the upright wall, the fins being fixed to both sides of the upright wall. Since the fins are relatively short, as compared to vertical fins upstanding from a horizontal base, heat transfer efficiency is high and aluminum fins may be used, reducing weight and cost.

According to one construction of the upright wall embodiment, the base plate is formed as two identical L-shaped members, each member having a base portion and an upright portion, the upright portions being fixed together to form the upright wall, the base portions forming the base plate. Each upright portion is formed with an upright channel portion, the upright channel portions being formed as troughs which capture the condenser portion of the heat pipe. The L-shaped members may be cast of zinc or aluminum, once again reducing weight and cost. Aluminum fins may be epoxied to the upright wall.

The single heat pipe in the heat sink according to the invention acts as two or three heat pipes. Unlike a U-shaped heat pipe with one evaporator and two condensers, the inventive heat pipe has multiple evaporators and one or more looped condenser sections. Since there are multiple paths for condensate to return to the source, the heat pipe is less likely to dry out at elevated power conditions or unfavorable orientations with respect to gravity.

To summarize, the heat sink according to the invention offers the following advantages with respect to the prior art:

Poor performance due to low fin efficiency can be improved on heat sinks that are taller than they are wide;

the mass of the heat sink fin structure can be reduced dramatically by using aluminum instead of copper, due to the high heat transfer efficiency of shorter fins;

the mass of the base structure can be reduced by using aluminum instead of copper, due to good coverage of multiple evaporators;

cost can be reduced by using aluminum or zinc castings. The use of multiple evaporators over the source offsets the poor thermal properties of the cast aluminum;

removal of fin area over the mounting hardware can be minimized with the horizontal fin structure;

the wattage at which the heat pipe dries out, i.e. fails to operate is improved for multiple orientations, due to multiple return paths from the condenser.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
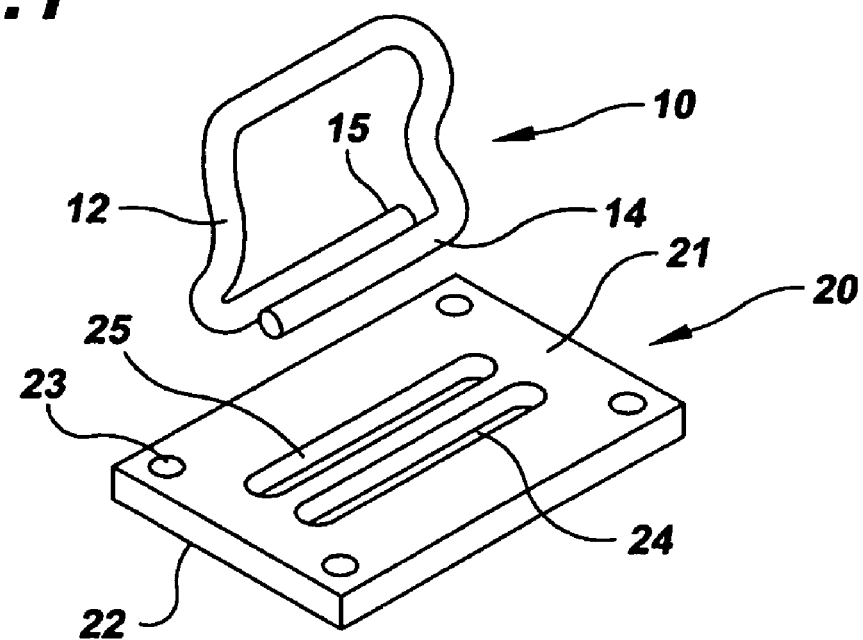
FIG. 1 is an exploded perspective view of a base plate and a heat pipe formed with a loop.
Figure 2:
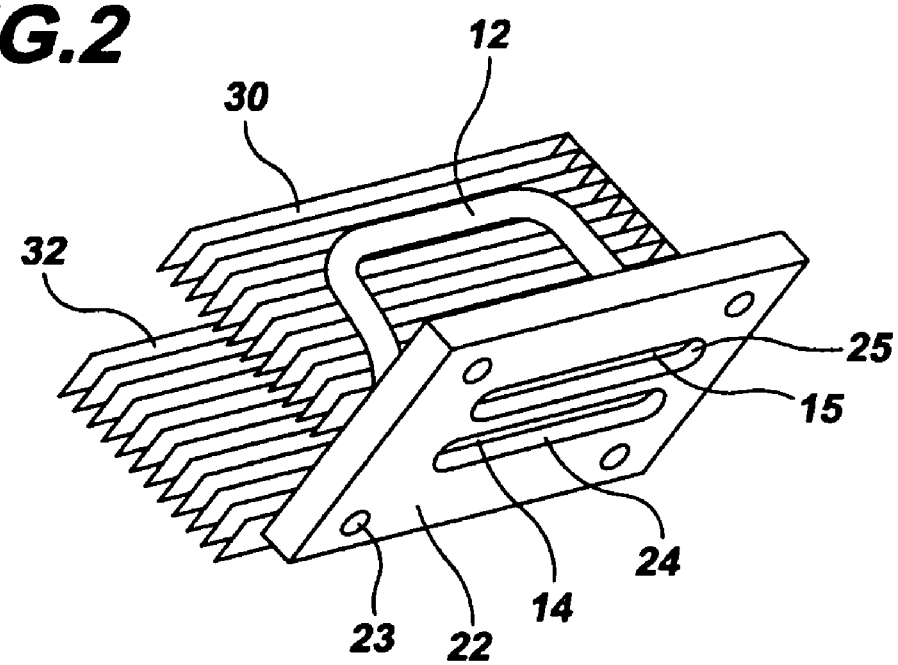
FIG. 2 is a bottom perspective view of a heat sink made with the base plate and heat pipe of FIG. 1, with cooling fins on one side of the loop.

FIGS. 1 and 2 show a simple embodiment of the heat sink according to the invention, which includes a heat pipe 10, a base plate 20, and fins 30 (FIG. 2). The heat pipe 10 is formed as a loop having an upright condenser portion 12, and a pair of opposed ends 14, 15 which serve as evaporators. The base plate 20 has a top surface 21, a bottom surface 22, a pair of base channels 24, 25 in the form of parallel slots which extend between the surfaces 21, 22, and mounting holes 23 for mounting the heat sink to a PCB or other support. The ends 14, 15 of the heat pipe 10 are received in respective channels 24, 25 so that they are flush with the bottom surface 22 and can thereby be received directly against a component to be cooled, thereby serving as evaporators. In order to increase the contact area of the evaporators with the component, the ends 14, 15 are preferably deformed or machined to present flat surfaces to the component. The bottom surface 22 of the base plate 20 may be also provided with tubular standoffs over the holes 23 in order to space the heat sink from a PCB or the like on which a component (not shown) is mounted.

The fins 30 are directly attached to the condenser portion 12 by solder or epoxy, and may be in the form of folded fins, i.e. a sheet of copper or aluminum which is folded back and forth with 180 degree bends. Where folded fins are used, they may be deformed against the condenser portion as disclosed in U.S. Pat. No. 6,688,380. While fins are shown on only one side of the condenser in FIG. 2, this is only for reasons of clarity, Preferably, fins will be present on both sides of the condenser in the finished heat sink. Notches 32 provide for access to mounting hardware received in holes 23.

Figure 3:
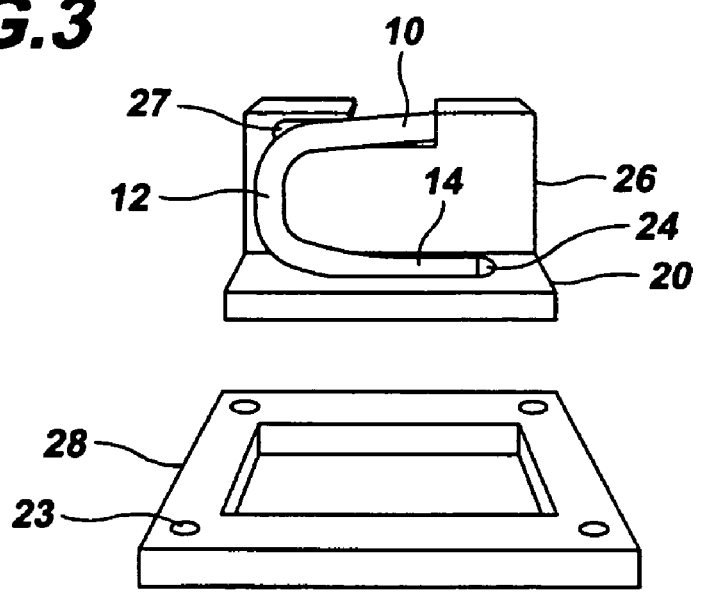
FIG. 3 is an exploded perspective view of a T-shaped base plate and a frame, the base plate having an upright wall with a heat pipe assembled thereto.

FIG. 3 shows a heat pipe 10 fitted to a base plate 20 having an upright wall 26 with an upright channel 27 profiled to receive half of the condenser 12 on one side of the wall and to channel the condenser to the other side of the wall. Except for a transition between the evaporator portions 14, 15 in channels 24, 25 and the channel 27 in wall 26, the heat pipe 10 is substantially flush with the surfaces of the wall, and may be deformed or machined to provide flat surfaces for improved contact with the edges of fins 30 (FIGS. 4 and 5).

From the standpoint of thermal conductivity and solderability, copper is the preferred material for the base plate 20. Where an increased mounting area is needed, the base plate 20 can be staked or otherwise fixed in an aluminum mounting frame 28. Where optimal heat transfer is not necessary, the base plate may be made of aluminum and incorporate mounting holes so that the mounting frame 28 is not necessary.

Figure 4:
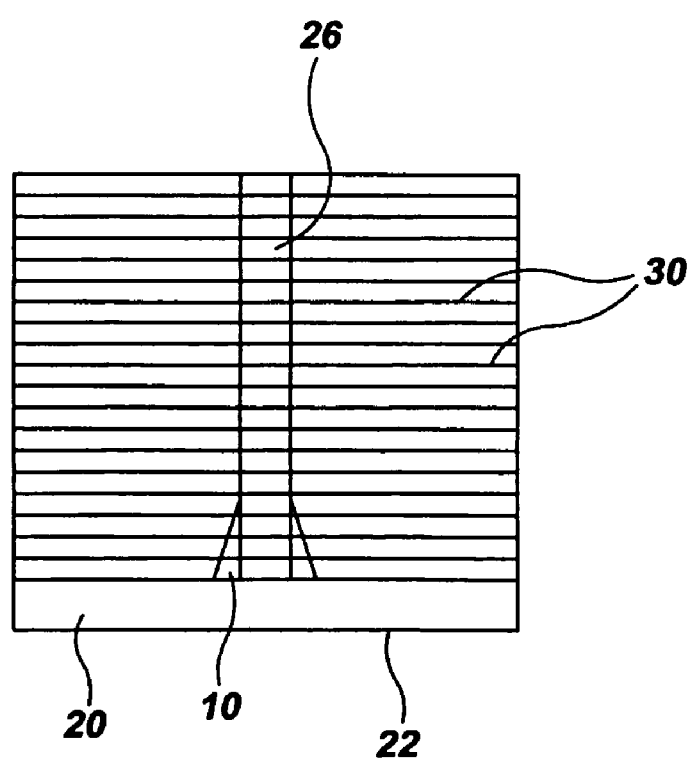
FIG. 4 is an end view of the heat sink of FIG. 3, with cooling fins surrounding the upright wall.

As shown in FIG. 4, the fins 30 extend on both sides of the upright wall 26 and are relatively short compared to fins extending vertically from a conventional heat sink. Since optimal thermal conductivity may not be necessary with the shorter fins, the fins may be made of aluminum to reduce weight and cost. The fins on each level may provided by a single sheet having a rectangular slot which receives the upright wall, and notches in the lower fins to accommodate the transition portions of the heat pipe. Alternatively, where the wall extends to the edges of the base plate, the fins on each level may be provided as a pair of discrete fins fixed to opposite sides of the wall.

Figure 5:
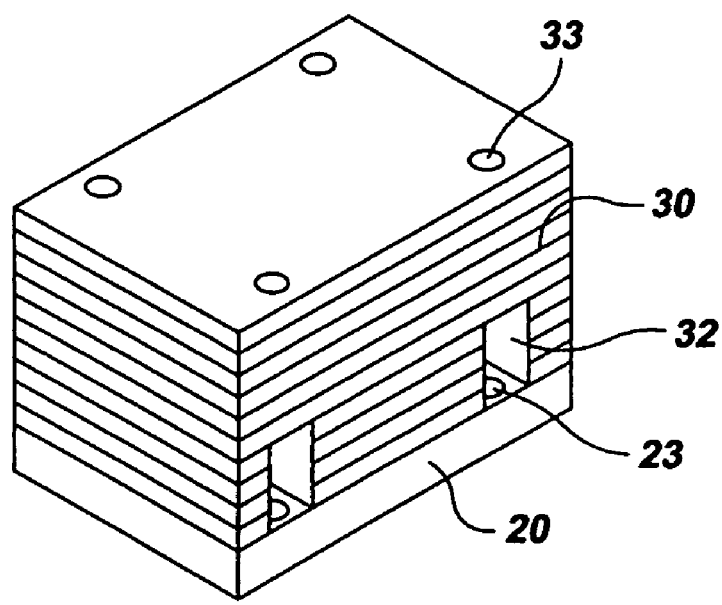
FIG. 5 is a perspective of the heat sink of FIG. 3.

FIG. 5 is a perspective view of the heat sink of FIG. 3. The mounting hardware may be placed in notches 32 below the upper level of fins, the latter having maximum surface areas for dissipating heat, with only small access holes 33 for accessing the hardware, e.g. with a screw driver.

Figure 6:
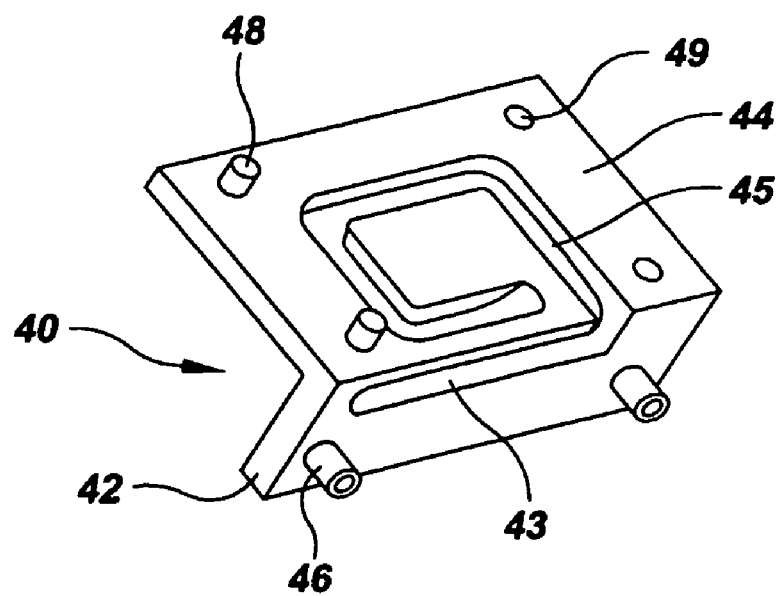
FIG. 6 is a perspective view of a single L-shaped member which forms part of the base plate and upright wall.

FIG. 6 shows an L-shaped member 40 having a base portion 42 provided with a base channel 43 and integral standoffs 46, and an upright wall portion 44 having an upright channel portion 45. A pair of these members are fitted together so that the upright portions 44 form an upright wall and the base portions 42 form a base plate. The members are identical, the pegs 48 on one member being received in the holes 49 on the other member. The members 40 are preferably produced as castings of aluminum or zinc for cost reasons and ease of assembly to a preformed heat pipe.

Figure 7:
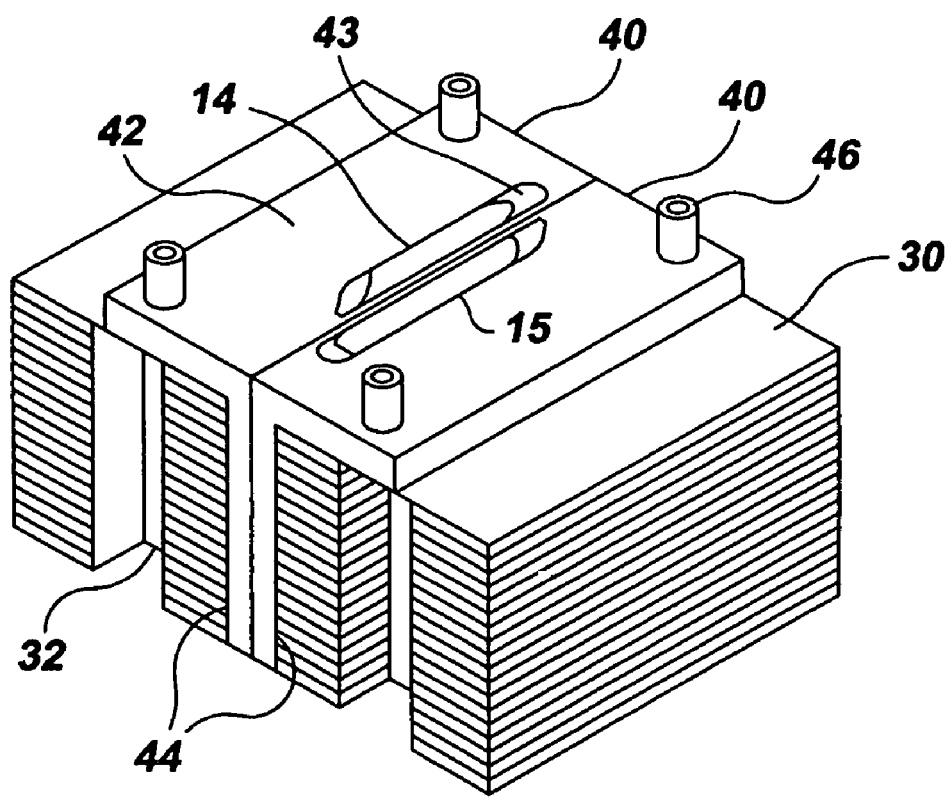
FIG. 7 is a bottom perspective view of heat sink made with a pair of L-shaped members.

FIG. 7 shows a finished heat sink utilizing the L-shaped members 40 of FIG. 6, which are fitted together with a heat pipe 10, the condenser portion (not visible) being received in the channel portions 45, the ends 14, 15 being received in respective base channels 43. With the two-piece wall, the upright channel portions 45 are preferably formed as troughs which sandwich the condenser therebetween, in contrast to the external channel in the one piece upright wall 26 shown in FIG. 3. The condenser is thus substantially concealed within the upright wall to which the fins 30 are attached.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A heat sink comprising:
   a base plate for fitting against a component to be cooled;
   a heat pipe formed in a loop having a condenser portion upstanding from the base plate and a pair of ends which form a pair of evaporator portions in thermal contact with said base plate and extending parallel to said base plate; and
   a plurality of cooling fins having an edge shaped to receive a portion of the periphery of said condenser portion to provide direct thermal contact with said condenser portion at said edge, said fins extending substantially parallel to said base plate.

2. The heat sink of claim 1 wherein said base plate comprises at least one channel which receives said evaporator portions of said heat pipe.

3. The heat sink of claim 2 wherein said at least one channel comprises at least one aperture through said base plate, whereby said evaporator portions can directly abut said component.

4. The heat sink of claim 2 wherein said at least one channel comprises at least one trough in said base plate.

5. The heat sink of claim 2 wherein said at least one channel comprises a pair of channels.

6. The heat sink of claim 1 wherein said evaporator portions are substantially parallel.

7. The heat sink of claim 1 further comprising an upright wall upstanding from said base plate between said evaporator portions, said upright wall having an upright channel which receives said condenser.

8. The heat sink of claim 7 wherein said fins are fixed to at least one side of said upright wall.

9. The heat sink of claim 7 wherein said base plate and said upright wall are made of copper.

10. The heat sink of claim 9 further comprising a circumferential aluminum frame in which the base plate is fitted.

11. The heat sink of claim 7 wherein said base plate and said upright wall are formed by a pair of L-shaped members, each said L-shaped member having a base portion and an upright portion, said upright portions being juxtaposed to form said upright wall, said base portions forming said base plate.

12. The heat sink of claim 11 wherein each said base portion is formed with a base channel and each said upright portion is formed with an upright channel portion, said upright channel portions forming said upright channel in said upright wall, said condenser portion being received in said upright channel portions, said evaporator portions being received in respective said base channels.

13. The heat sink of claim 12 wherein said upright channel portions are formed as troughs in said upright portions, said condenser being captured between said upright channel portions.

14. The heat sink of claim 12 wherein said members are identical castings.

15. The heat sink of claim 14 wherein said castings each have posts and holes, the posts of one casting being received in the holes of the other casting.

16. The heat sink of claim 12 wherein the condenser portion of the heat pipe is deformed to conform to said upright channel portions.

17. The heat sink of claim 1 further comprising additional fins disposed on said plurality of cooling fins, said additional fins not having an edge shaped to receive a portion of the periphery of the condenser portion.

18. The heat sink of claim 1 wherein said plurality of cooling fins comprise folded fins.

19. The heat sink of claim 1 wherein said plurality of cooling fins comprises a first plurality of cooling fins disposed on one side of said condenser portion, and further comprising a second plurality of cooling fins disposed on another side of said condenser portion.

* * * * *